(12) United States Patent
Yang et al.

(10) Patent No.: US 7,605,072 B2
(45) Date of Patent: Oct. 20, 2009

(54) INTERCONNECT STRUCTURE WITH A BARRIER-REDUNDANCY FEATURE

(75) Inventors: Chih-Chao Yang, Poughkeepsie, NY (US); Louis L. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 11/925,161

(22) Filed: Oct. 26, 2007

(65) Prior Publication Data

US 2008/0108220 A1    May 8, 2008

Related U.S. Application Data

(62) Division of application No. 11/308,220, filed on Mar. 13, 2006, now Pat. No. 7,348,648.

(51) Int. Cl.
*H01L 21/4763* (2006.01)

(52) U.S. Cl. .................. 438/618; 438/627; 438/629; 438/643; 257/E21.32; 257/E21.347; 257/E21.475; 257/E21.685

(58) Field of Classification Search ................ 438/618, 438/580, 582, 589, 595, 311, 931, 680, 692, 438/627, 629, 643, 648, 650, 683, 685, 687, 438/706, 712, 745, 769, 791
See application file for complete search history.

(56) References Cited

U.S. PATENT DOCUMENTS

| | | | |
|---|---|---|---|
| 5,264,377 A | 11/1993 | Chesire et al. | |
| 5,514,974 A | 5/1996 | Bouldin | |
| 5,770,519 A | 6/1998 | Klein et al. | |
| 6,096,637 A | 8/2000 | Sriram et al. | |
| 6,147,361 A | 11/2000 | Lin et al. | |
| 6,365,503 B1 | 4/2002 | Huang et al. | |
| 6,515,368 B1 | 2/2003 | Lopatin et al. | |
| 6,573,606 B2 | 6/2003 | Sambucetti et al. | |
| 6,709,874 B2 | 3/2004 | Ning | |
| 7,348,648 B2 * | 3/2008 | Yang et al. | 257/428 |
| 2001/0030366 A1 * | 10/2001 | Nakano et al. | 257/758 |
| 2002/0072223 A1 | 6/2002 | Gilbert et al. | |
| 2003/0207560 A1 * | 11/2003 | Dubin et al. | 438/629 |
| 2004/0224497 A1 * | 11/2004 | Barth | 438/637 |

* cited by examiner

*Primary Examiner*—David Nhu
(74) *Attorney, Agent, or Firm*—Scully, Scott, Murphy & Presser, P.C.; Katherine S. Brown, Esq.

(57) ABSTRACT

An interconnect structure that includes a barrier-redundancy feature which is capable of avoiding a sudden open circuit after an electromigration (EM) failure as well as a method of forming the same are provided. In accordance with the present invention, the barrier-redundancy feature is located within preselected locations within the interconnect structure including in a wide line region, a thin line region or any combination thereof. The barrier-redundancy feature includes an electrical conductive material located between, and in contact with, a conductive line diffusion barrier of a conductive line and a via diffusion barrier of an overlying via. The presence of the inventive barrier-redundancy feature creates an electrical path between the via diffusion barrier along the sidewalls of the via and the conductive line diffusion barrier along the sidewalls of the conductive line. This electrical path generated by the inventive barrier-redundancy feature can avoid a sudden open circuit resulting from EM failure at the bottom of the via. The presence of the inventive barrier-redundancy feature within an interconnect structure provides sufficient time for chip replacement or system operation.

19 Claims, 7 Drawing Sheets

INTERCONNECT STRUCTURE WITH A BARRIER-REDUNDANCY FEATURE

RELATED APPLICATION

This application is a divisional application of U.S. patent application Ser. No. 11/308,220, filed Mar. 13, 2006, now U.S. Pat. No. 7,348,648.

DESCRIPTION

1. Field of the Invention

The present invention relates to a semiconductor structure and a method of fabricating the same. More particularly, the present invention relates to an interconnect structure including a barrier-redundancy feature that avoids a sudden open circuit after an electromigration failure has been detected by a monitoring device. The present invention also relates to a method of fabricating an interconnect structure which includes the above-mentioned feature.

2. Background of the Invention

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, -based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than silicon dioxide.

In typical interconnect structures, a void accumulation under the contact vias is frequently observed inside an operating semiconductor device. This void accumulation is undesirable since it will slow down signal transmission speed because of increasing electrical resistivity and eventually can cause the circuit to open as soon as the void size covers the entire contact area. This problem of void accumulation is shown in FIG. 1. Specifically, FIG. 1 is a cross-sectional SEM (scanning electron micrograph) image of a prior art interconnect structure illustrating this particular problem.

The above mentioned failure results from a current density divergence at the contact area and is attributed to a phenomenon of electromigration (EM) failure inside the conductive interconnect. As the feature size of current semiconductor devices scales, EM will become worse and the accumulation time before an open circuit happens will get shorter and shorter.

The aforementioned problem is now further described with reference to FIGS. 2, 3A and 3B. Specifically, and in the case in which the overlying contact via and the underlying metal line have comparable critical dimension size, the diffusion barrier 113 around sidewalls of the via contacts the diffusion barrier 114 on sidewalls of the underlying metal line as shown at region 112 in FIG. 2. The barrier-to-barrier contact, i.e., barrier-redundancy, offers an electrical path when electromigration failure happens and avoids a sudden completely open circuit. In the other case, however, the barrier-redundancy feature cannot be reached through a regular process when the contact via size is smaller than the underlying metal line, at area 111 in FIG. 2. In this case, a circuit is dead as soon as the electromigration failure happens. A top-view comparison between areas 111 and 112 is shown in FIGS. 3A and 3B, respectively. As is shown, the EM failure mentioned above exists for wide lines of an interconnect structure, rather than for thin lines. The term "wide lines" is used to describe the case in which the dimension of the line is wider than the overlying via contact, i.e., D/d>1 in FIG. 3B. This case is shown at area 111 in FIG. 2. The term "thin lines" is used to describe the case in which the metal line is substantially the same as, or narrower than, that of the overlying via contact, i.e., D/d≦1 in FIG. 3B. This case is shown at area 112 in FIG. 2.

Much research endeavors have been devoted to provide methods to improve the EM resistance of interconnect structures. Included within these endeavors are U.S. Pat. Nos. 6,515,368, 6,365,503, 6,096,637 and 5,770,519. Although methods to improve EM resistance are known, the above-mentioned void problem in wide lines of interconnect structures has not been previously recognized and thus no adequately solution for alleviating the same is known in the prior art.

In view of the above, there is a continued need for providing an interconnect structure which includes a feature which is capable of avoiding a sudden open circuit caused by EM failure.

SUMMARY OF THE INVENTION

The present invention provides an interconnect structure that includes a barrier-redundancy feature which is capable of avoiding a sudden open circuit after an electromigration (EM) failure as well as a method of forming the same. In accordance with the present invention, the barrier-redundancy feature is located within preselected locations of the interconnect structure including, for example, in a wide line region, a thin line region or any combination thereof. When present only in a wide line region, the barrier-redundancy feature is capable of avoiding metal-metal shorts at critical macros.

In accordance with the present invention, the barrier-redundancy feature includes an electrical conductive material located between, and in contact with, a diffusion barrier of a conductive line and a diffusion barrier of an overlying via. The presence of the inventive barrier-redundancy feature creates an electrical path between the via diffusion barrier along the sidewalls of the via and the conductive line diffusion barrier along the sidewalls of the underlying conductive line. This electrical path generated by the inventive barrier-redundancy feature can avoid a sudden open circuit resulting from EM failure at the bottom of the via. The presence of the inventive barrier-redundancy feature within an interconnect structure provides sufficient time for chip replacement or system operation adjustment after an EM failure has been detected. A separate invention, U.S. Ser. No. 11/306,985, filed Jan. 18, 2006 entitled "ON-CHIP ELECTROMIGRATION MONITORING SYSTEM" is pending within the United States Patent and Trademark Office and would be employed with the present invention in advanced semiconductor products.

In general terms, the interconnect structure of the present invention includes:

a conductively filled via located within an upper interconnect level, said conductively filled via having sidewalls that are lined with a via diffusion barrier;

a conductive line located within a lower interconnect level and connected to said conductively filled via, said conductive line having sidewalls that are lined with a conductive line diffusion barrier, said via diffusion barrier is not in direct contact with said conductive line diffusion barrier; and an electrical conductive material located between, and in contact with, said conductive line diffusion barrier and said via diffusion barrier thereby creating an electrical path between the via diffusion barrier along the sidewalls of the conductively filled via and the conductive line diffusion barrier along the sidewalls of the conductive line.

In accordance with the present invention, a dielectric capping layer is positioned between the upper and lower interconnect level. Unlike prior art interconnect structures wherein this dielectric capping layer is typically in contact with the sidewalls of the via contact and thus extends atop some of the conductive line of the lower interconnect level, the dielectric capping layer in the inventive interconnect structure is not in contact, nor does it extend upon, the conductive line where the electrical conductive material is located. It is further noted that the dielectric capping layer does not contact the sidewalls of the via contact in areas where the electrical conductive material is present.

In one embodiment of the present invention, an interconnect structure is provided that includes:

a conductively filled via located within an upper interconnect level, said conductively filled via having sidewalls that are lined with a via diffusion barrier;

a Cu conductive line located within a lower interconnect level and connected to said conductively filled via, said Cu conductive line having sidewalls that are lined with a conductive line diffusion barrier, said via diffusion barrier is not in direct contact with said conductive line diffusion barrier; and an electrical conductive material located between, and in contact with, said conductive line diffusion barrier and said via diffusion barrier thereby creating an electrical path between the via diffusion barrier along the sidewalls of the conductively filled via and the conductive line diffusion barrier along the sidewalls of the conductive line.

As indicated above, the present invention also provides a method of fabricating the above-mentioned interconnect structure in which a barrier-redundancy feature has been selectively introduced therein to provide an electrical path along sidewalls of the via and conductive line.

In general terms, the method of the present invention includes:

providing a structure including a dielectric capping layer located on a surface of a lower interconnect dielectric having at least one conductive line embedded therein, said at least one conductive line is separated from said lower interconnect dielectric by a conductive line diffusion barrier;

selectively removing said dielectric capping layer from a surface of said at least one conductive line providing an exposed surface;

forming an electrical conductive material on the exposed surface of the at least one conductive line; and forming an upper interconnect dielectric having at least one conductively filled via that is located above said at least one conductive line, said at least one conductively filled via having a barrier material covering sidewalls thereof, wherein said electrical conductive material is located between, and in contact with, said conductive line diffusion barrier and said via diffusion barrier thereby creating an electrical path between the via diffusion barrier along the sidewalls of the electrically filled via and the conductive line diffusion barrier along the sidewalls of the conductive line.

DETAILED DESCRIPTION OF THE INVENTION

The present invention, which provides an interconnect structure including a barrier-redundancy feature that avoids a sudden open circuit after an electromigration failure has been detected by a monitoring device and a method of fabricating the same, will now be described in greater detail by referring to the following description and drawings that accompany the present application. The drawings of the present application, which are referred to herein below in greater detail, are provided for illustrative purposes and, as such, they are not drawn to scale.

Before describing the basic process flow, it is noted that the following description illustrates a preferred embodiment of the present invention in which the barrier-redundancy feature is located with a wide line of the interconnect structure.

Figure 1:
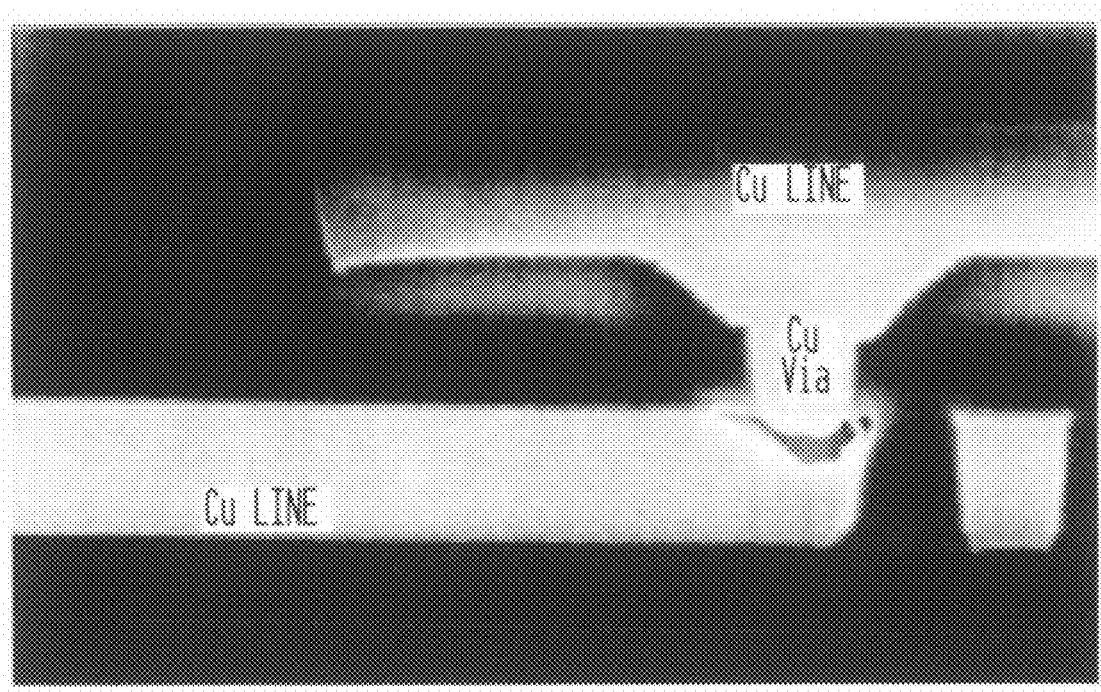
FIG. 1 is a cross sectional SEM image of a prior art interconnect structure showing void formation at via bottom.
Figure 2:
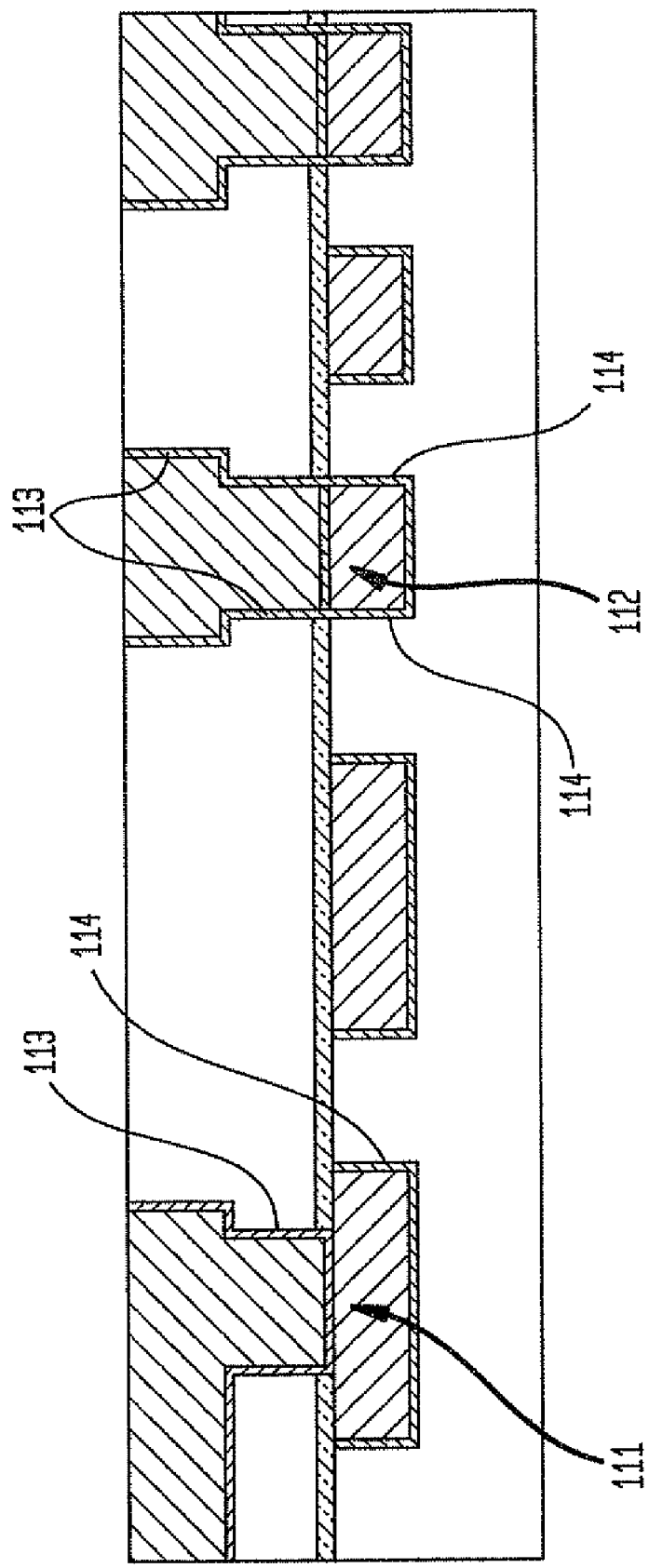
FIG. 2 is a pictorial representation (through a cross sectional view) illustrating a prior art interconnect structure.
Figure 3A:
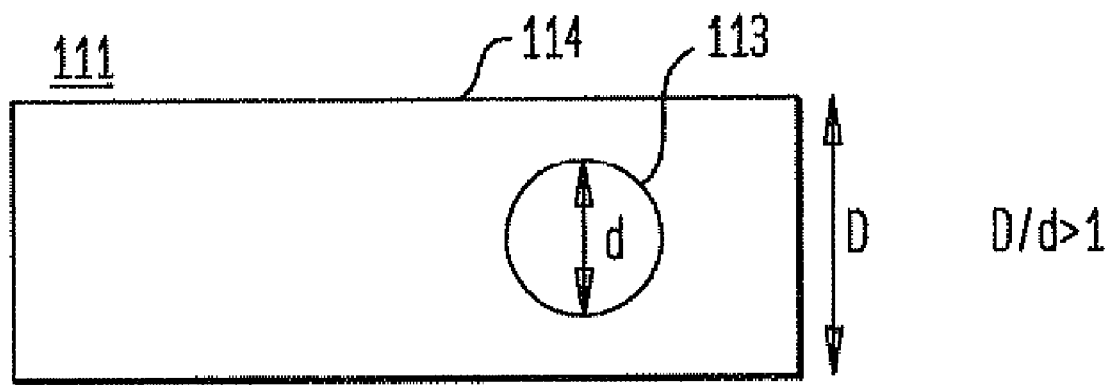
FIGS. 3A and 3B are top-down views of areas 111 and 112, respectively, shown in FIG. 2.
Figure 3B:
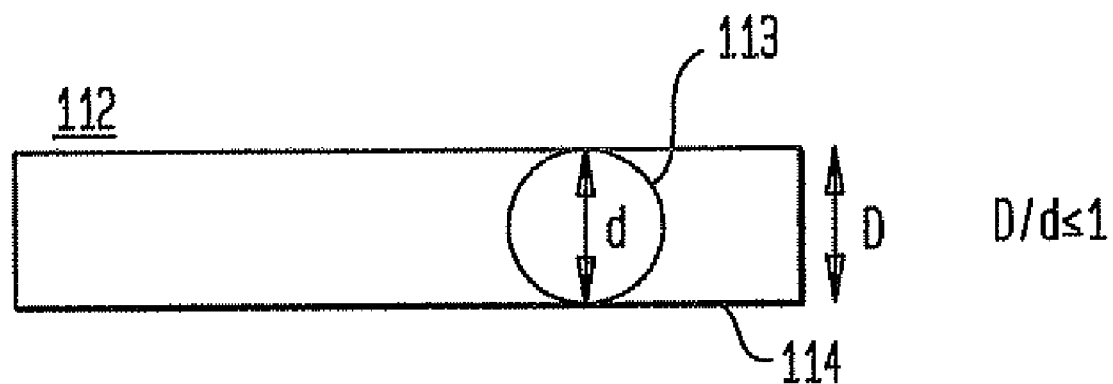
Figure 4A:
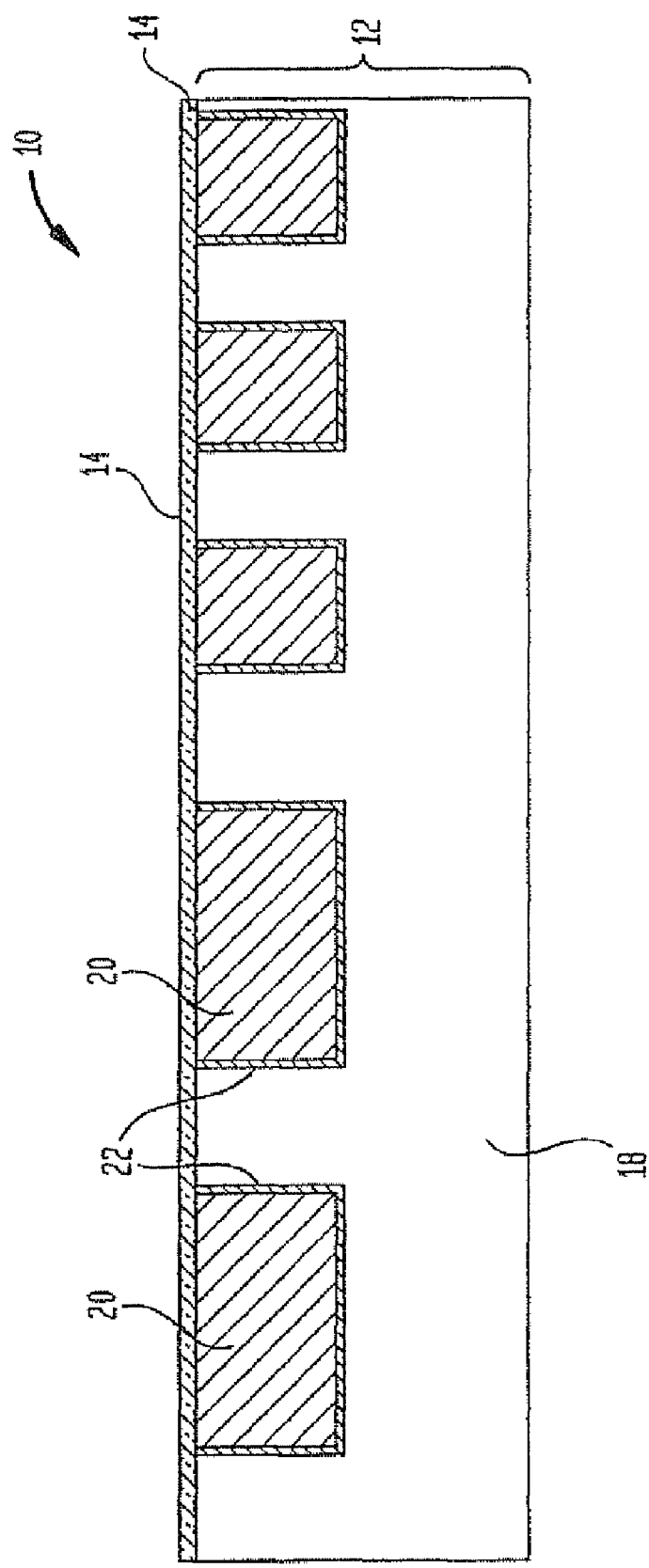
FIGS. 4A-4F are pictorial representations (through cross sectional views) illustrating the basic processing steps of the present invention.

The process flow of the present invention begins with providing the initial interconnect structure 10 shown in FIG. 4A. Specifically, the initial interconnect structure 10 shown in FIG. 4A comprises a lower interconnect level 12 having a dielectric capping layer 14 disposed thereon. The lower interconnect level 12, which may be located above a semiconductor substrate including one or more semiconductor devices, comprises a first dielectric material 18 having at least one conductive line 20 that is separated from the first dielectric material 18 by a conductive line diffusion barrier 22.

The initial interconnect structure 10 shown in FIG. 4A is fabricated utilizing standard interconnect processing which is well known in the art. For example, the initial interconnect structure 10 can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conductive material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous. Some examples of suitable dielectrics that can be used as the first dielectric material 18 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive line 20 that is embedded in (i.e., located within) the first dielectric material 18. The conductive line 20 comprises a conductive region that is separated from the first dielectric material 18 by a conductive line diffusion barrier (i.e., a diffusion barrier within the conductive line) 22. The width of the conductive line 20 formed may vary such that some of the conductive lines 20 are wider than other conductive lines. The conductive line 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the conductive line diffusion barrier 22 and then with a conductive material forming the conductive region. The conductive line diffusion barrier 22, which may comprise Ta, TaN, Ti, TiN, Ru, RuN, W, WN, CoWP or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the conductive line diffusion barrier 22 may vary depending on the exact means of the deposition process as well as the material employed. Typically, the conductive line diffusion barrier 22 has a thickness from about 4 to about 40 nm, with a thickness from about 7 to about 20 nm being more typical.

Following the conductive line diffusion barrier 22 formation, the remaining region of the opening within the first dielectric material 18 is filled with a conductive material forming the conductive line 20. The conductive material used in forming the conductive line 20 includes, for example, polySi, a conductive metal, an alloy comprising at least one conductive metal, a conductive metal silicide or combinations thereof. Preferably, the conductive material that is used in forming the conductive line 20 is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the conductive line diffusion barrier 22 and the conductive line 20 each have an upper surface that is substantially coplanar with the upper surface of the first dielectric material 18.

After forming the at least one conductive line 20, the dielectric capping layer 14 is formed on the surface of the lower interconnect level 12 (including atop the first dielectric layer 18 and the conductive line 20) utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the dielectric capping layer 14 may vary depending on the technique used to form the same as well as the material make-up of the layer. Typically, the dielectric capping layer 14 has a thickness from about 15 to about 55 nm, with a thickness from about 25 to about 45 nm being more typical.

Figure 4B:
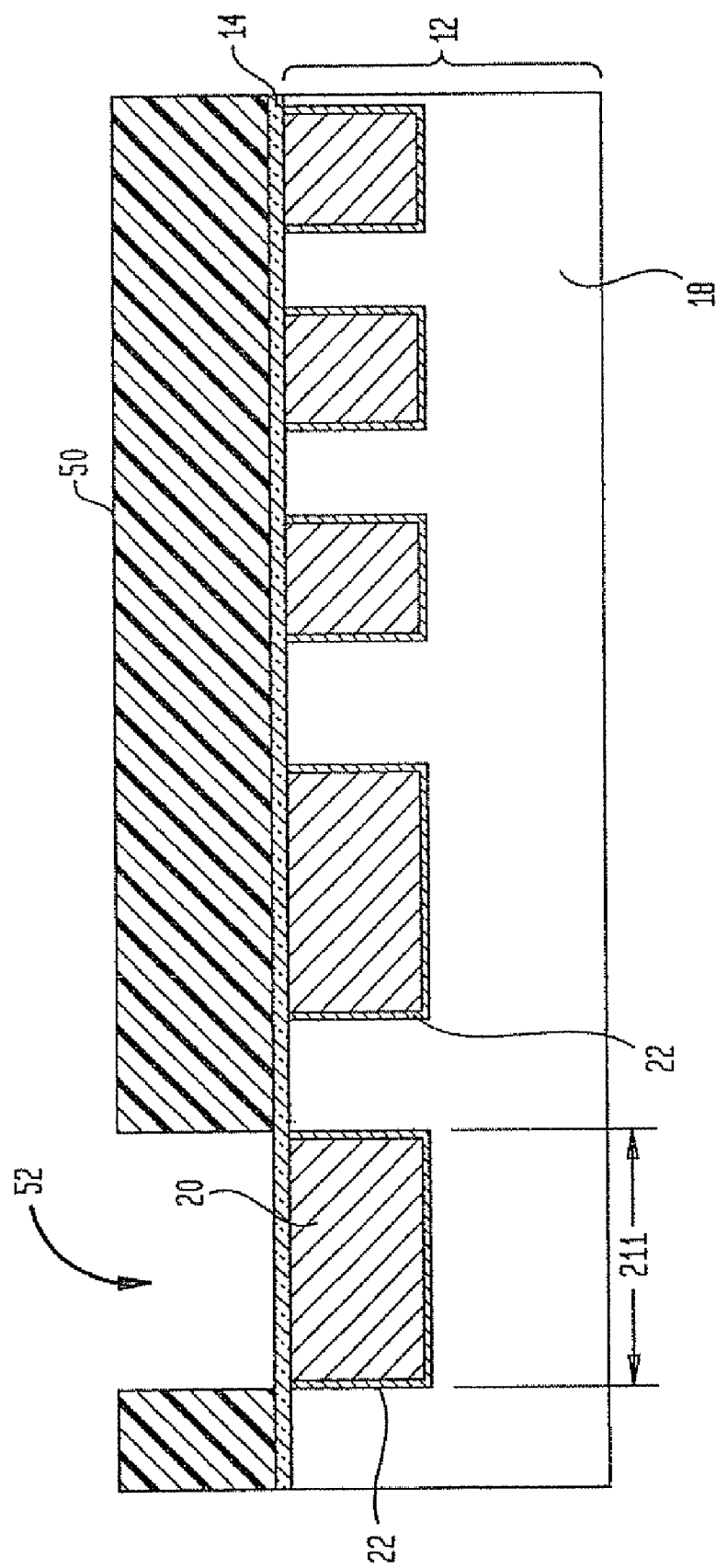

Next, a patterned photoresist 50 having at least one opening 52 is provided on the structure illustrated in FIG. 4A. This structure including the patterned photoresist 50 is shown, for example in FIG. 4B. The patterned photoresist 50 is formed by first applying a blanket photoresist layer to the initial structure 10 shown in FIG. 4A. The blanket photoresist layer comprises any conventional photoresist material (positive-tone, negative tone, or hybrid-type) and it is formed utilizing any conventional deposition means including, for example, spin-on coating, chemical vapor deposition (CVD) and physical vapor deposition. The thickness of the applied photoresist material, which is within conventional ranges, is not critical for practicing the claimed invention. After applying the blanket layer of photoresist to the initial structure 10, the blanket photoresist layer is subjected to a lithographic process, which includes exposing the resist to a desired pattern of radiation and developing the exposed resist utilizing a conventional resist developer. As shown in FIG. 4B, the at least one opening 52 formed into the photoresist layer is located atop a conductive line 20 that is relatively wide. The wide conductive line is located at area 211 of the structure shown in FIG. 4B.

After providing the patterned photoresist 50, an exposed portion of the dielectric capping layer 14 within the at least one opening 52 is removed utilizing an etching process that is selective to the material of the dielectric capping layer 14, stopping atop a surface of conductive line 20. A dry etching process such as reactive-ion etching is typically utilized. The opening of the exposed dielectric capping layer 14 within the at least opening 52 may also be performed by utilizing a chemical wet etching process. It is observed that a portion of conductive line 20 at area 211 is now exposed.

Figure 4C:
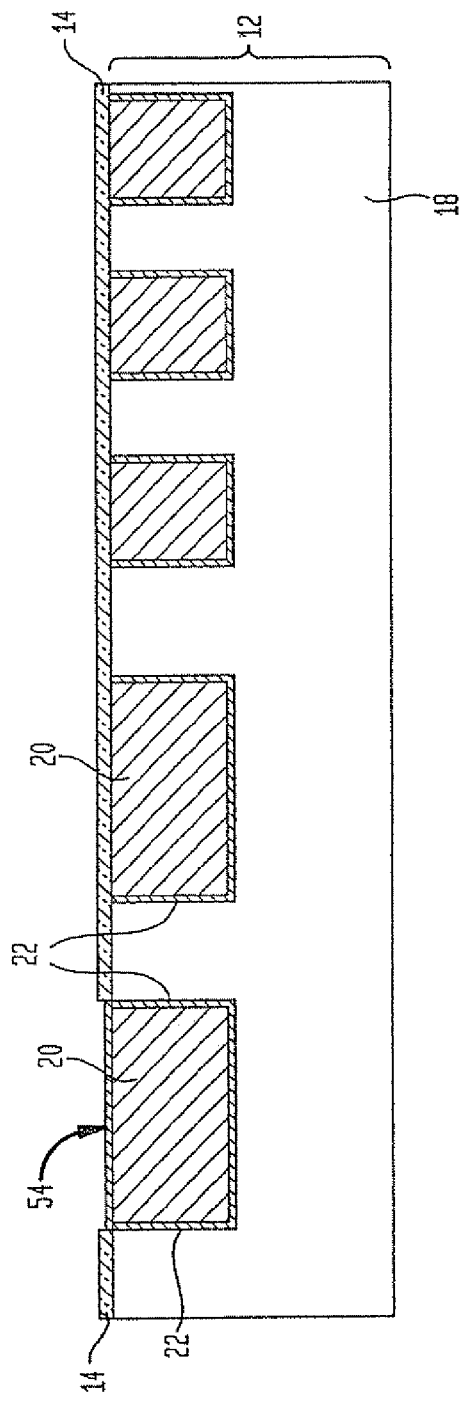

FIG. 4C illustrates the structure of FIG. 4B after removing the patterned photoresist 50 from the structure. Any conventional resist stripping process can be used to remove the patterned photoresist 50 from the structure. FIG. 4C also illustrates a selective deposition of an electrical conductive material 54 on top of conductive line 20 at area 211. The selectively deposited electrical conductive material 54 employed in this embodiment of the present invention comprises any material with electromigration resistance (i.e., diffusion barrier) properties. Because of the selectivity between conductive material 20 and dielectric cap material 14, the conductive material 54, which may be composed of Co, Co-containing alloys, e.g., Co (W, P, B, Mo, Re), or other materials, can only be deposited on the exposed conductive line 20 surface, but not on dielectric cap material 14 surface. The deposition process in this embodiment of the present invention can be carried out by electro-plating, electro less plating or other like deposition methods. The thickness of the electrical conductive material 54 in this embodiment may vary depending on the exact means of the deposition process as well as the material employed. Typically, the electrical conductive material 54 has an as-deposited thickness from about 4 to about 40 nm, with a thickness from about 7 to about 20 nm being more typical. As is illustrated in FIG. 4C, the electrical conductive material 54 is located atop the exposed surface of the conductive line 20 at area 211. At this point of the present invention, the electrical conductive material 54 typically, but not always, has an upper surface that is substantially lower than that of the upper surface of the dielectric cap layer 14.

Figure 4D:
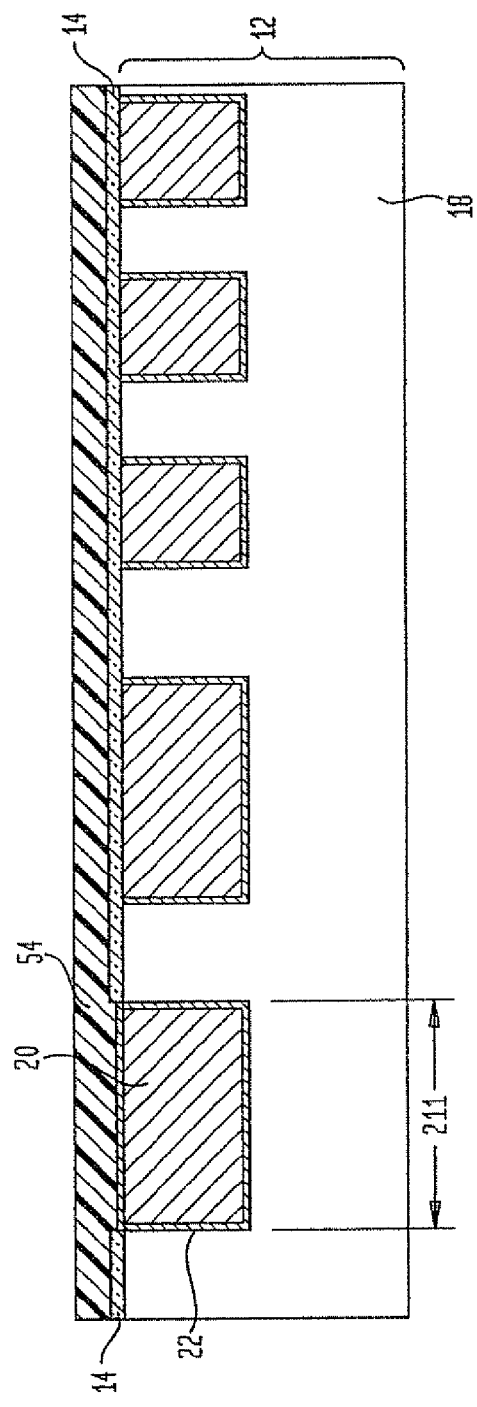

An alternative way of doing the conductive material deposition is a "non-selective" method as shown in FIG. 4D. Specifically, FIG. 4D illustrates the structure after an electrical conductive material 54 is formed atop the exposed surface of the conductive line 20 at area 211 as well as atop the remaining portions of dielectric capping layer 14. The electrical conductive material 54 employed in this embodiment of the present invention comprises any material with electromigration resistance (i.e., diffusion barrier) properties. Suitable materials for the electrical conductive material 54 for this embodiment of the present invention include the same or different materials as conductive line diffusion barrier 22. The electrical conductive material 54, which may comprise Ta, TaN, Ti, TiN, Ru, RuN, W, WN, CoWP or any other material that can serve as a barrier to prevent conductive material from diffusing there through, is formed by a non-selective deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. Of the various non-selective methods, PVD is preferred. The thickness of the electrical conductive material 54 may vary depending on the exact means of the non-selective deposition process as well as the material employed. Typically, and for this non-selective embodiment of the present invention, the electrical conductive material 54 has an as-deposited thickness from about 20 to about 60 nm, with a thickness from about 30 to about 50 nm being more typical.

Figure 4E:
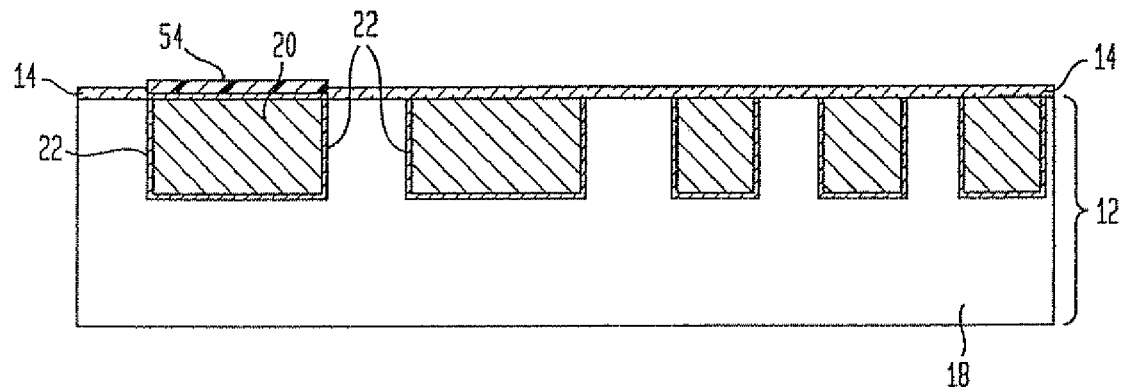

FIG. 4E illustrates the structure of FIG. 4D after subjecting the same to a planarization process using the dielectric capping layer 14 as an etch stop layer. As is illustrated in FIG. 4E, the remaining electrical conductive material 54 is located atop the exposed surface of the conductive line 20 at area 211. At this point of the present invention, the remaining electrical conductive material 54 typically, but not always, has an upper surface that is substantially co-planar with that of the upper surface of the dielectric cap layer 14.

Next, an upper interconnect level 16 is formed by first applying a second dielectric material 24 to the upper exposed surfaces of the structure shown in FIG. 4C or FIG. 4E (i.e., atop the capping layer 14 and the remaining electrical conductive material 54). The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. Next, at least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation.

Typically, the at least one opening includes a via opening and a line opening. The via opening is located below the line opening in the second interconnect level 16, yet above the conductive lines 20 in the first interconnect level 12. In instances when a via opening and a line opening are formed, the etching step also removes portions of the dielectric capping layer 14 and the electrical conductive material 54 in that are located atop the conductive line 20 in order to make electrical contact between interconnect level 12 and level 16.

Next, a via diffusion barrier 30 having diffusion barrier properties is provided by forming the via diffusion barrier 30 on exposed surfaces (including wall surfaces within the opening) on the second dielectric material 24. The via diffusion barrier 30 comprises a same or different material as that of conductive line diffusion barrier 22. Thus, via diffusion barrier 30 may comprise Ta, TaN, Ti, TiN, Ru, RuN, W, WN, CoWP or any other material that can serve as a barrier to prevent a conductive material from diffusing there through. Combinations of these materials are also contemplated forming a multilayered stacked diffusion barrier. The via diffusion barrier 30 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the via diffusion barrier 30 may vary depending on the number of material layers within the barrier, the technique used in forming the same as well as the material of the diffusion barrier itself. Typically, the via diffusion barrier 30 has a thickness from about 4 to about 40 nm, with a thickness from about 7 to about 20 nm being even more typical.

After forming the via diffusion barrier 30, a plating seed layer (not shown) may be optionally formed. Although optional, it is preferred to include a plating seed layer within the structure to aid in growth of the conductive material. This is especially the case when a conductive metal or metal alloy is to be subsequently formed within the at least one opening. When present, the plating seed layer may comprise a conductive metal or metal alloy such as that used in forming the conductive material 38 to be described in greater detail herein below. Typically, and when the conductive material 38 comprises Cu, the plating seed layer comprises Cu, CuAl, CuIr, CuTa, CuRh, TaRu, or other alloys of Cu, i.e., Cu-containing alloys.

The plating seed layer is formed by a conventional deposition process including, for example, ALD, CVD, PECVD, PVD, chemical solution deposition and other like deposition processes. The thickness of the plating seed layer may vary and it is within ranges that are well known to those skilled in the art. Typically, the plating seed layer has a thickness from about 2 to about 80 nm.

Next, an interconnect conductive material 38 is formed within the at least one opening.

The interconnect conductive material 38 may comprise the same or different, preferably the same, conductive material as that of the conductive line 20. Preferably, Cu, Al, W or alloys thereof are used, with Cu or AlCu being most preferred. The conductive material 38 is formed utilizing the same deposition processing as described above in forming the conductive line 20 and following deposition of the conductive material, the structure is subjected to planarization. The planarization process removes the diffusion barrier 30, plating seed layer and conductive material 38 that is present above the upper horizontal surface of the upper interconnect level 16 providing the structure shown in FIG. 4F.

Figure 4F:
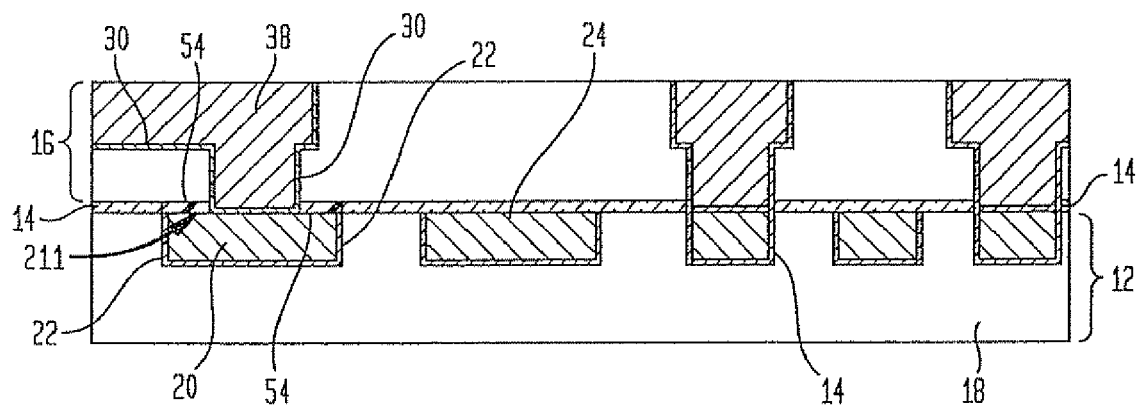
Figure 5:
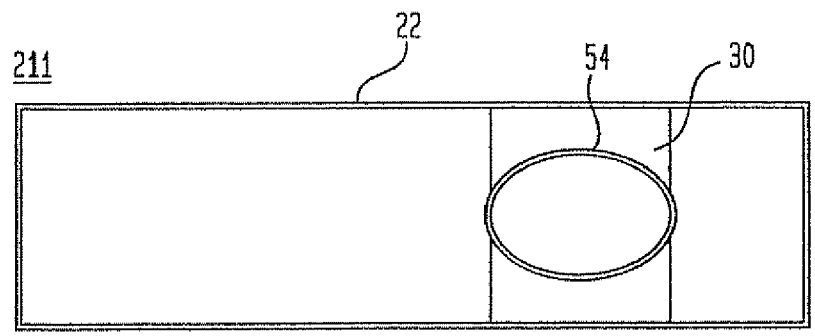
FIG. 5 is a top-down view of area 211 shown in FIG. 4F.

Specifically, FIG. 4F illustrates a cross-sectional view of an interconnect structure of the present invention. As shown, the electrical conductive material 54 provides an electrical path between the conductive line diffusion barrier 22 and the via diffusion barrier 30. As such, the electrical conductive material 54, the conductive line diffusion barrier 22 and the via diffusion barrier 30 are used in conjunction in the illustrated structure to form a barrier-redundancy feature therein. This electrical path provided by the barrier redundancy feature can avoid a sudden circuit opening that results from an EM failure at the bottom of a via. Thus, a barrier-redundancy feature has been provided to an interconnect structure that offers a sufficient time for chip replacement or system operation adjustment after an EM failure has been detected by a monitoring device. FIG. 5 shows a top down view at area 211 of FIG. 4F.

In some embodiments of the present invention, the above processing steps can be used to provide this same barrier redundancy feature to thin lines shown in the example above. In this case, the barrier redundancy feature can avoid possible metal-metal shorts at these areas of the interconnect structure.

It should be noted that the basic processing steps described above can be repeated to form one of more interconnect levels above the uppermost interconnect level illustrated in FIG. 4F.

The structure shown in FIG. 4F represents one possible embodiment of the present invention in which a closed-via bottom structure is formed. In a closed-via bottom structure, via diffusion barrier 30 is present on portions of conductive line 20. Open-via bottom and anchored-via bottom structure are also possible. The open-via structure is formed by removing the via diffusion barrier 30 from the bottom of the via utilizing ion bombardment or another like directional etching process prior to deposition of the other elements of the upper interconnect level. The anchored-via bottom structure is formed by first etching a recess into the conductive line 20 utilizing a selective etching process and creating a gouging feature. The second interconnect level 16 described above is then filled with the conductive material 38 by utilizing one of the above-mentioned techniques.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an interconnect structure comprising:
   providing a structure including a dielectric capping layer located on a surface of a lower interconnect dielectric having at least one conductive line embedded therein, said at least one conductive line is separated from said lower interconnect dielectric by a conductive line diffusion barrier;
   selectively removing said dielectric capping layer from a surface of said at least one conductive line providing an exposed surface;
   forming an electrical conductive material on the exposed surface of the at least one conductive line; and
   forming an upper interconnect dielectric having at least one conductively filled via that is located above said at least one conductive line, said at least one conductively filled via having a barrier material covering at least sidewalls thereof, wherein said electrical conductive material is located between, and in contact with, said conductive line diffusion barrier and said via diffusion barrier thereby creating an electrical path between the via diffusion barrier along the sidewalls of the electrically filled via and the conductive line diffusion barrier along the sidewalls of the conductive line and said electroconductive material having a sidewall edge in direct contact with a sidewall edge of said dielectric capping layer.

2. The method of forming an interconnect structure according to claim 1 wherein said selectively removing said dielectric capping layer comprises forming a patterned photoresist layer on said dielectric capping layer, said patterned photoresist including at least one opening that lays atop the conductive line, and etching exposed portions of the dielectric capping layer, stopping on a surface of the conductive line.

3. The method of forming an interconnect structure according to claim 1 wherein said forming an electrical conductive material comprises either selective deposition or non-selective deposition methods.

4. The method of forming an interconnect structure according to claim 1 wherein after forming said electrical conductive material, said dielectric capping layer is not in contact, nor does it extend upon the conductive line wherein the electrical conductive material is located.

5. The method of forming an interconnect structure according to claim 1 wherein said via diffusion barrier and said conductive line diffusion barrier are comprised of the same or different material as that of the electrical conductive material.

6. The method of forming an interconnect structure according to claim 5 wherein said via diffusion barrier and said conductive line diffusion barrier are comprised of one of Ta, TaN, Ti, TiN, Ru, RuN, W, WN or CoWP.

7. The method of forming an interconnect structure according to claim 1 wherein said conductive line and said conductively filled via are both comprised of Cu.

8. The method of forming an interconnect structure according to claim 3 wherein said forming an electrical conductive material comprises selective deposition selected from electroplating and electroless plating.

9. The method of forming an interconnect structure according to claim 8 wherein said electrical conductive material comprises Co or a Co-containing alloy including at least one of W, P, B Mo and Re.

10. The method of forming an interconnect structure according to claim 3 wherein said forming an electrical conductive material comprises non-selective deposition selected from atomic layer deposition, chemical vapor deposition, physical vapor deposition, sputtering, chemical solution deposition and plating.

11. The method of forming an interconnect structure according to claim 10 further comprising planarizing the electrical conductive material utilizing the dielectric capping layer as an etch stop layer.

12. A method of forming an interconnect structure comprising:
   providing a structure including a dielectric capping layer located on a surface of a lower interconnect dielectric having at least one conductive line embedded therein, said at least one conductive line is separated from said lower interconnect dielectric by a conductive line diffusion barrier;

selectively removing said dielectric capping layer from a surface of said at least one conductive line providing an exposed surface, said selectively removing said dielectric capping layer comprises forming a patterned photoresist layer on said dielectric capping layer, said patterned photoresist including at least one opening that lays atop the conductive line, and etching exposed portions of the dielectric capping layer, stopping on a surface of the conductive line;

forming an electrical conductive material on the exposed surface of the at least one conductive line; and forming an upper interconnect dielectric having at least one conductively filled via that is located above said at least one conductive line, said at least one conductively filled via having a barrier material covering at least sidewalls thereon wherein said electrical conductive material is located between, and in contact with, said conductive line diffusion barrier and said via diffusion barrier thereby creating an electrical path between the via diffusion barrier along the sidewalls of the electrically filled via and the conductive line diffusion barrier along the sidewalls of the conductive line.

13. The method of forming an interconnect structure according to claim 12 wherein said forming an electrical conductive material comprises either selective deposition or non-selective deposition methods.

14. The method of forming an interconnect structure according to claim 12 wherein after forming said electrical conductive material, said dielectric capping layer is not in contact, nor does it extend upon the conductive line wherein the electrical conductive material is located.

15. The method of forming an interconnect structure according to claim 14 wherein said via diffusion barrier and said conductive line diffusion barrier are comprised of the same or different material as that of the electrical conductive material.

16. The method of forming an interconnect structure according to claim 13 wherein said forming an electrical conductive material comprises selective deposition selected from electroplating and electroless plating.

17. The method of forming an interconnect structure according to claim 16 wherein said electrical conductive material comprises Co or a Co-containing alloy including at least one of W, P, B Mo and Re.

18. The method of forming an interconnect structure according to claim 13 wherein said forming an electrical conductive material comprises non-selective deposition selected from atomic layer deposition, chemical vapor deposition, physical vapor deposition, sputtering, chemical solution deposition and plating.

19. The method of forming an interconnect structure according to claim 14 further comprising planarizing the electrical conductive material utilizing the dielectric capping layer as an etch stop layer.

* * * * *